US011557357B2

(12) United States Patent
Muchherla et al.

(10) Patent No.: US 11,557,357 B2
(45) Date of Patent: Jan. 17, 2023

(54) SELECTION OF READ OFFSET VALUES IN A MEMORY SUB-SYSTEM

(71) Applicant: Micron Technology, Inc., Boise, ID (US)

(72) Inventors: Kishore Kumar Muchherla, Fremont, CA (US); Vamsi Pavan Rayaprolu, San Jose, CA (US); Larry J. Koudele, Erie, CO (US)

(73) Assignee: Micron Technology, Inc., Boise, ID (US)

( * ) Notice: Subject to any disclaimer, the term of this patent is extended or adjusted under 35 U.S.C. 154(b) by 74 days.

(21) Appl. No.: 17/014,583

(22) Filed: Sep. 8, 2020

(65) Prior Publication Data

US 2022/0076765 A1    Mar. 10, 2022

(51) Int. Cl.
*G11C 7/04*  (2006.01)
*G11C 16/34* (2006.01)
*G11C 16/10* (2006.01)
*G11C 16/32* (2006.01)
*G11C 16/26* (2006.01)

(52) U.S. Cl.
CPC ............ *G11C 16/3459* (2013.01); *G11C 7/04* (2013.01); *G11C 16/10* (2013.01); *G11C 16/26* (2013.01); *G11C 16/32* (2013.01); *G11C 16/3404* (2013.01)

(58) Field of Classification Search
CPC ....... G11C 16/3459; G11C 7/04; G11C 16/10; G11C 16/26; G11C 16/32; G11C 16/3404
USPC .................................................. 365/185.22
See application file for complete search history.

(56) References Cited

U.S. PATENT DOCUMENTS

| 8,042,102 | B2 * | 10/2011 | DeWitt, Jr. | ........... | G06F 9/3857 |
| | | | | | 717/128 |
| 2016/0147582 | A1 * | 5/2016 | Karakulak | ............ | G06F 11/073 |
| | | | | | 714/37 |
| 2019/0243704 | A1 * | 8/2019 | Muchherla | ........... | G11C 29/028 |

\* cited by examiner

*Primary Examiner* — Huan Hoang
*Assistant Examiner* — Minh Dinh
(74) *Attorney, Agent, or Firm* — Lowenstein Sandler LLP

(57) ABSTRACT

An example memory sub-system to receive a request to execute a read operation associated with data of a memory unit of a memory sub-system. A time after program associated with the data is determined. The time after program is compared to a threshold time level to determine if a first condition is satisfied or a second condition is satisfied. The memory sub-system selects one of a first set of read offset values based on the time after program in response to satisfying the first condition, or a second set of read offset values based on a data state metric measurement in response to satisfying the second condition.

20 Claims, 8 Drawing Sheets

SELECTION OF READ OFFSET VALUES IN A MEMORY SUB-SYSTEM

Embodiments of the disclosure are generally related to memory sub-systems, and more specifically, are related to selection of read offset values in a memory sub-system.

BACKGROUND

A memory sub-system can be a storage system, a memory module, or a hybrid of a storage device and memory module. The memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Figure 1:
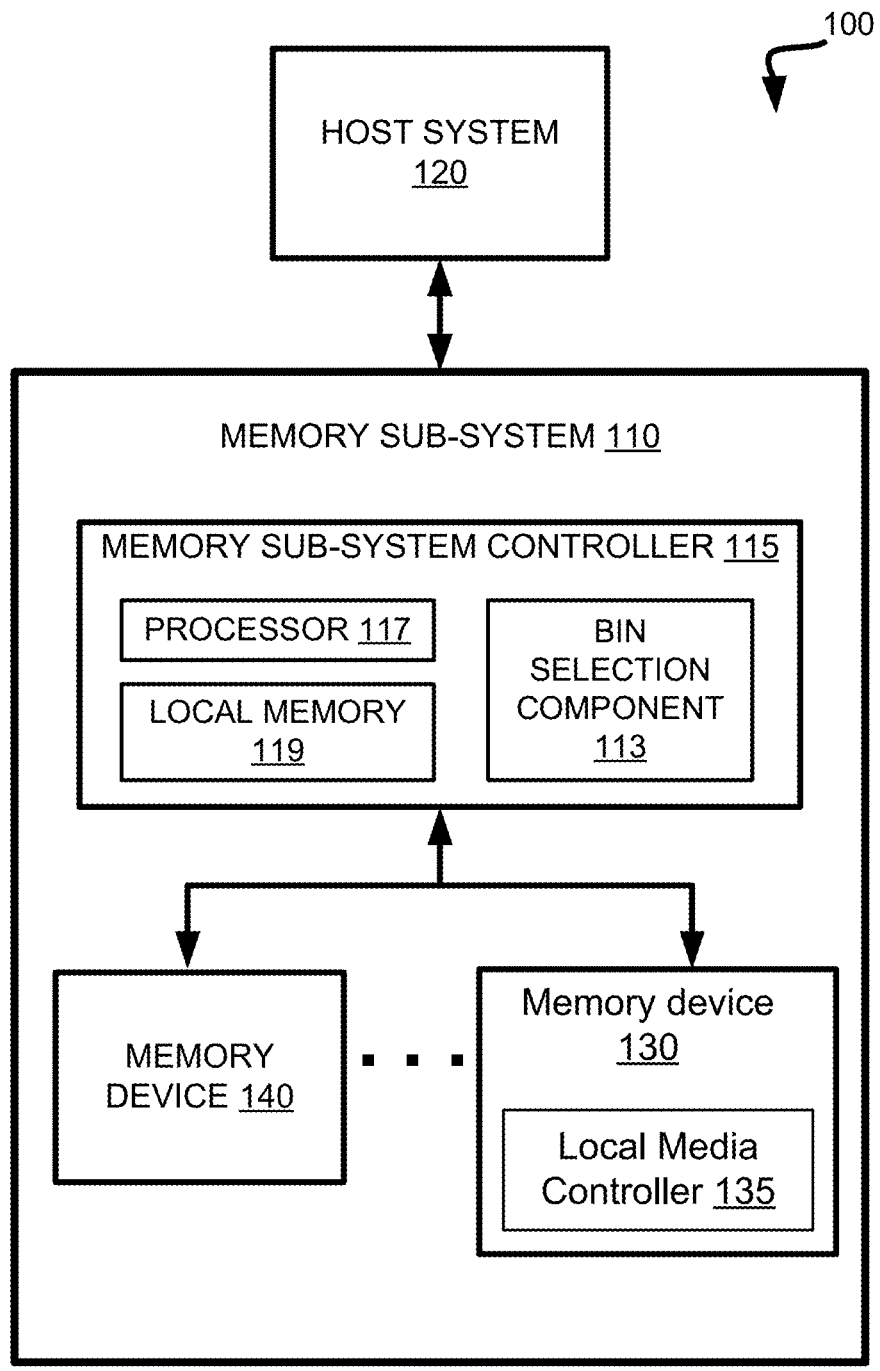
FIG. 1 illustrates an example computing system that includes a memory sub-system in accordance with some embodiments of the present disclosure.

Aspects of the present disclosure are directed to selection of read offset values in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. One example of non-volatile memory devices is a negative-and (NAND) type flash memory device. Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory unit (e.g., a memory cell, memory block, memory page, a memory block family, etc.) changes in time as the electric charge of the cell is degrading, which is referred to as "temporal voltage shift" (since the degrading electric charge causes the voltage distributions to shift along the voltage axis towards lower voltage levels). Failure to mitigate the temporal voltage shift caused by the slow charge loss can result in the increased bit error rate in read operations. The threshold voltage changes rapidly at first (e.g., immediately after the memory unit was programmed), and then slows down in an approximately logarithmic linear fashion with respect to a time that elapsed since a programming event (also referred to as a "time after program"). In this regard, the temporal voltage shift function has a slope or rate of change that is relatively steep for the memory units that have a relatively small time after program (e.g., a younger portion of the memory units) and relatively shallow for the memory units that have a relatively large time after program (e.g., an older portion of the memory units).

To more efficiently manage the memory device, a memory sub-system controller can periodically perform a calibration process in order to associate a memory unit (e.g., a memory die, memory cell, a memory page, a memory block, a memory block family, etc.) with one of a predefined set of threshold voltage offset values (also referred to as "bins" or "threshold voltage offset bins"), which is in turn associated with a voltage offset to be applied for read operations (also referred to as "read offset values").

Upon receipt of a request to execute a read operation, an appropriate threshold voltage offset bin is selected for performing the read operation. Since the time after program has a significant impact on the temporal voltage shift, one approach is to select the threshold voltage offset bin for application in executing the read operation based solely on the time after program associated with the memory unit that is to be read. However, threshold voltage offset bin selection based on the time after program for all of available bins fails to compensate for temperature changes associated with the memory unit. The failure to account for temperature changes, particularly for bins associated with an older portion of the memory units (e.g., memory units having a relatively large time after program), results in miscalibration of the older memory units and a greater number of read errors.

Another approach to identifying a threshold voltage offset bin is to perform a scan to collect or measure a data state metric. A data state metric is a quantity that is measured or inferred from the behavior of data within the memory sub-system that provides information relating to a voltage state of that data. For example, the data state metric (e.g., an ideal read level value corresponding to a read level) may indicate the state of the temporal voltage shift, a state of temperature compensation miscalibration, a degree of read disturb, etc. However, due to the steep nature of the slope of the temporal voltage shift associated with the relatively older portion of the data, a high scan rate is necessary. In addition, scanning of the data state metric for the younger portion of the data results in additional and unnecessary scan processing for data having a relatively short time after program and shallow temporal voltage shifting.

Aspects of the present disclosure address the above-identified and other deficiencies by implementing a memory sub-system that dynamically selects a bin associated with a set of read threshold offset values for use in the execution of a read operation of a memory unit. The selection of the bin can be based on a time after program associated with the memory unit for data having a time after program that is less than a threshold time level (e.g., a younger data set or portion). The threshold time level can be set or established within the memory sub-system to a desired value (e.g., 4 hours, 6 hours, 8 hours, 12 hours, 16 hours, etc.) According to embodiments, the selection of the bin can be based on a scan of one or more data state metrics for data having a time after program that is greater than the threshold time level (e.g., an older data set or portion). In operation, in response to a request to execute a read operation relating to a memory unit, the time after program associated with the memory unit is identified. If, in an embodiment, the data to be read is within a younger data portion (e.g., the data has a time after program that is less than a threshold time level), the time after program value can be used to identify and select a bin including read offset values for use in the execution of the read operation. If, in an embodiment, the data to be read is within an older data portion (e.g., the data has a time after program that is greater than the threshold time level), a scan or measurement of a data state metric value associated with the data can be performed. Based on the data state metric measurement, a bin including read offset values is selected for execution of the read operation.

Advantageously, the identified time after program associated with the data to be read can be used to select a bin for the younger data portion because the degree or level of miscalibration due to changes in a slope of the temporal voltage shift function is relatively small as compared to data in the older data portion (e.g., data having a time to program that is greater than the threshold time level). Furthermore, another advantage is realized by using the time after program value to select a bin for the younger data set since there is a relatively greater level of margin in the corresponding bins (e.g., younger bins such as bin 0, bin 1, and bin 2) due to the wider valley margin associated with the corresponding read levels (e.g., a valley between read level 0 (L0) and read level 1 (L1), a valley between L1 and L2, a valley between L2 and L3). In addition, there is a relatively higher level of confidence in the time after program values associated with the younger data portion (and younger bins) since there are fewer intervening power cycles which would result in a reset or loss of time after program information.

Therefore, advantages of the systems and methods implemented in accordance with some aspects of the present disclosure include, but are not limited to, dynamically applying a time-based or scan-based approach to identifying a bin (e.g., set of read offset levels) for use in the execution of a read operation. Advantageously, the time-based approach including the selection of a bin based on a time after program associated with the data to be read is applied for a younger portion of the data (e.g., data having a time after program that is less than a threshold time level). Moreover, the scan-based approach including the selection of the bin based on the measurement of one or more data state metrics associated with the data to be read is applied for an older portion of the data (e.g., data having a time after program that is greater than a threshold time level).

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

Figure 2:
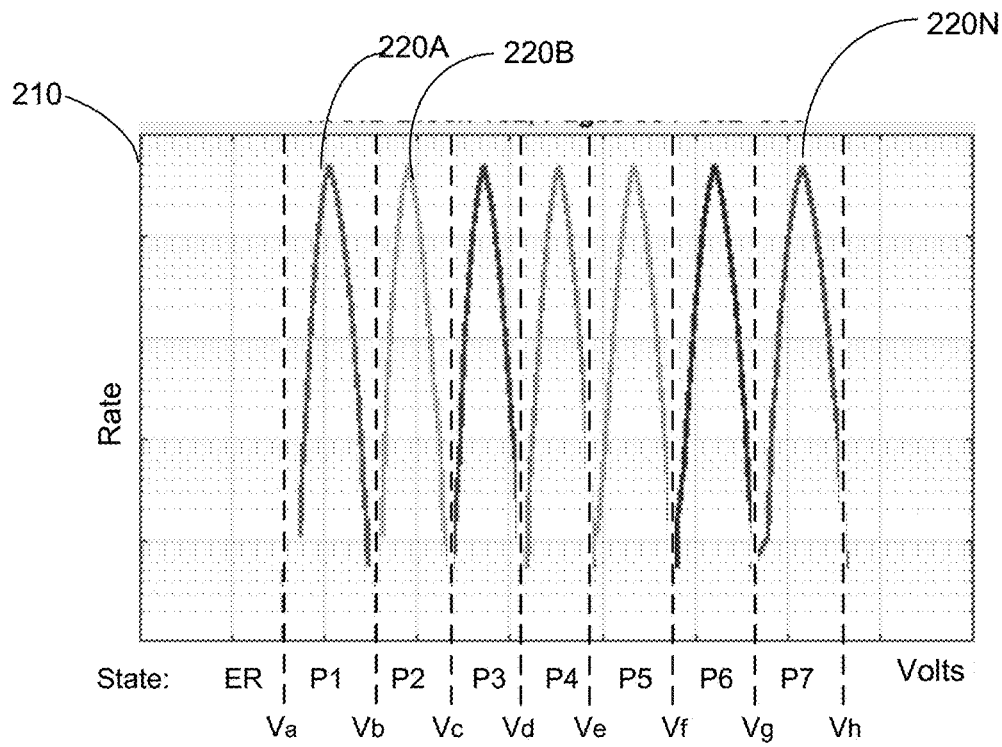
FIG. 2 depicts an example graph illustrating the dependency of the threshold voltage offset on the time after program (i.e., the period of time elapsed since the block had been programmed, in accordance with some embodiments of the present disclosure.
Figure 2:
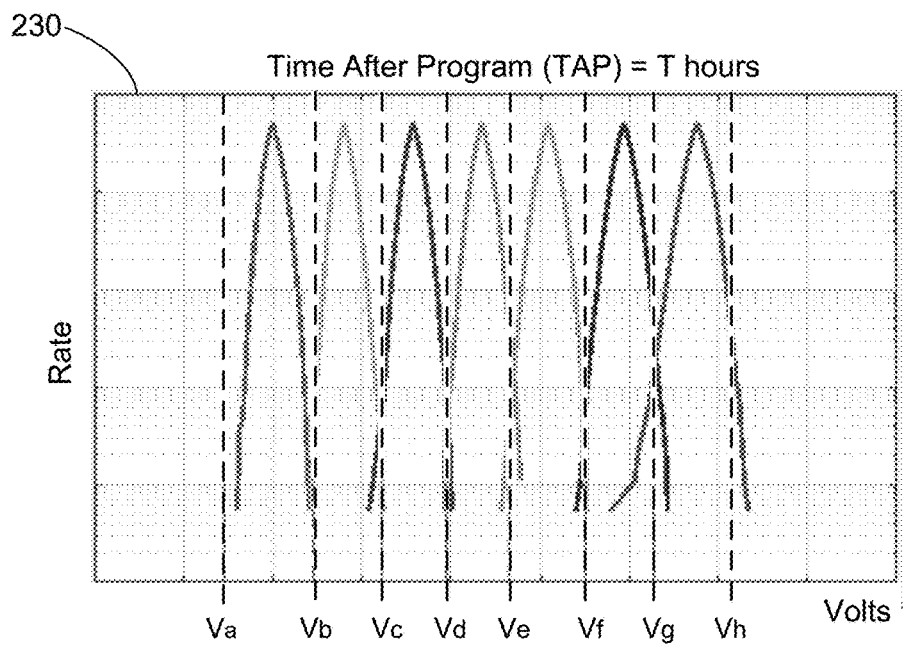

The memory sub-system 110 includes a bin selection component 113 that can be used to execute a bin selection process in response to a request for a read operation to manage the effects of temporal voltage shifting in a memory sub-system, as illustrated in FIG. 2. In some embodiments, the controller 115 includes at least a portion of the bin selection component 113. For example, the controller 115 can include a processor 117 (processing device) configured to execute instructions stored in local memory 119 for performing the operations described herein. In some embodiments, the bin selection component 113 is part of the host system 120, an application, or an operating system.

FIG. 2 schematically illustrates the temporal voltage shift caused by the slow charge loss exhibited by triple-level memory cells that is managed by the bin selection component 113 of the present disclosure. While the illustrative example of FIG. 2 utilizes triple-level cells, the same observations can be made and, accordingly, the same remedial measures are applicable to single level cells and multi-level cells in order to compensate for the slow charge loss.

A memory cell can be programmed (written to) by applying a certain voltage (e.g. program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with 2n different threshold voltage levels is capable of storing n bits of information.

Each of chart 210 and 230 illustrate program voltage distributions 220A-220N (also referred to as "program distributions" or "voltage distributions" or "distributions" herein) of memory cells programmed by a respective write level (which can be assumed to be at the midpoint of the program distribution) to encode a corresponding logical level ("000" through "111" in case of a TLC). The program distributions 220A through 220N can illustrate the range of threshold voltages (e.g., normal distribution of threshold voltages) for memory cells programmed at respective write levels (e.g., program voltages). In order to distinguish between adjacent program distributions (corresponding to two different logical levels), the read threshold voltage levels (shown by dashed vertical lines) are defined, such that any measured voltage that falls below a read threshold level is associated with one program distribution of the pair of adjacent program distributions, while any measured voltage that is greater than or equal to the read threshold level is associated with another program distribution of the pair of neighboring distributions.

In chart 210, eight states of the memory cell are shown below corresponding program distributions (except for the state labeled ER, which is an erased state, for which a distribution is not shown). Each state corresponds to a logical value. The threshold voltage levels are labeled Va-Vh. As shown, the ER state has a corresponding level of 111, and any measured voltage below Va is associated with the ER state. The states labeled P1, P2, P3, P4, P5, P6, and P7 correspond to distributions 220A-220N.

Time After Program (TAP) herein shall refer to the time since a cell has been written and is the primary driver of TVS (temporal voltage shift). TAP can be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from 8 to 12 minutes after program). A time slice can be referenced by its center point (e.g., 10 minutes).

As seen from comparing example charts 210 and 230, which reflect the time after programming (TAP) of 0 (immediately after programming) and the TAP of T hours, respectively, the program distributions change over time due primarily to slow charge loss. In order to reduce the read bit error rate, the corresponding read threshold voltages are adjusted to compensate for the shift in program distributions, which are shown by dashed vertical lines. In various embodiments of the disclosure, the temporal voltage shift is selectively tracked for die groups based on measurements performed at one or more representative dice of the die group. Based on the measurements made on representative dice of a die group that characterize the temporal voltage shift and operational temperature of the dice of the die group, the read threshold voltage offsets used to read the memory cells for the dice of the die group are updated and are applied to the base read threshold levels to perform read operations.

Figure 3:
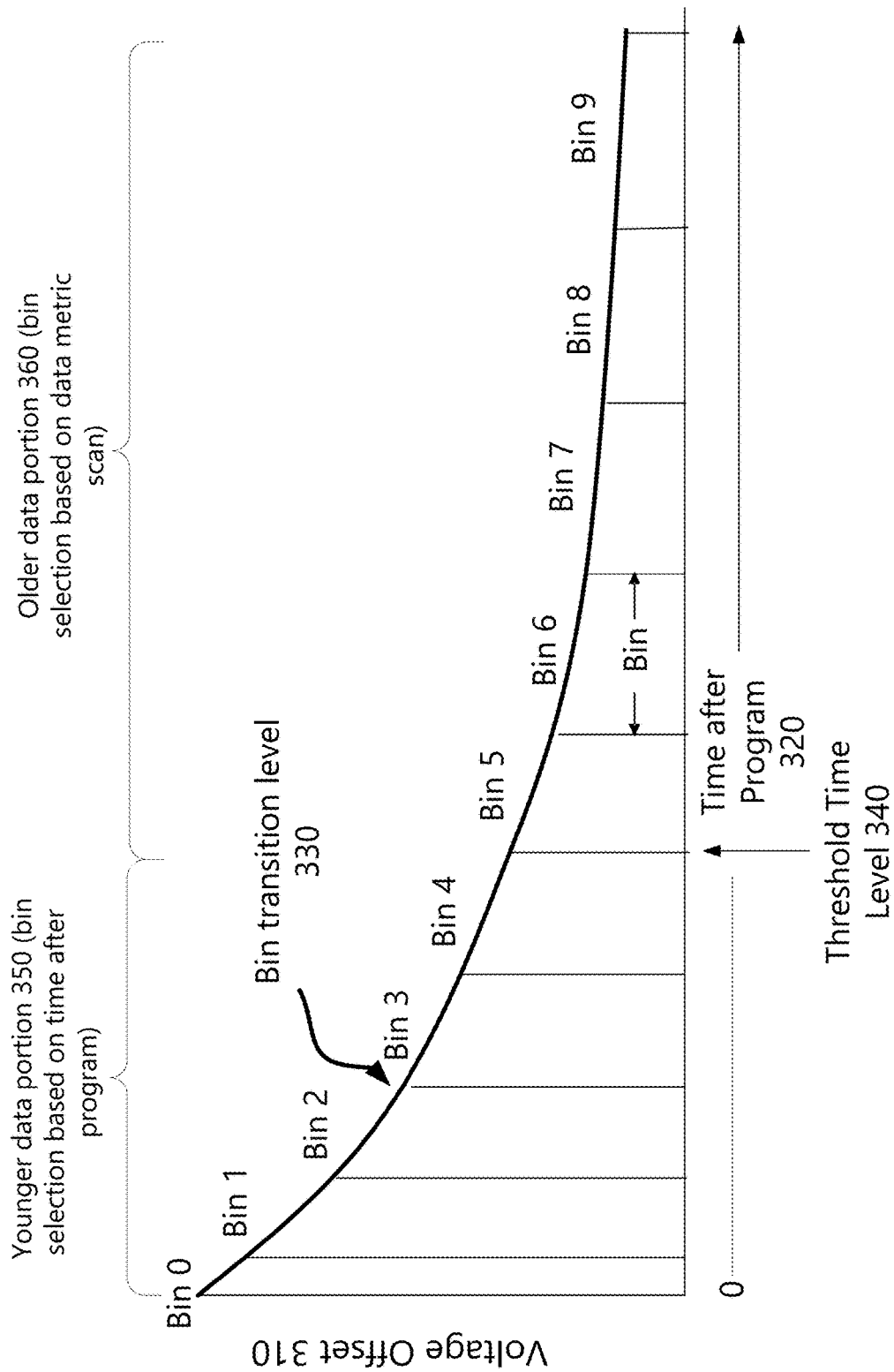
FIG. 3 schematically illustrates a set of predefined threshold voltage offset bins and a threshold time level for use in a bin selection process, in accordance with embodiments of the present disclosure

FIG. 3 depicts an example graph 300 illustrating a relationship between the threshold voltage offset 310 and the time after program 320 (i.e., the period of time elapsed since the block had been programmed) associated with the data managed by the bin selection component 113. In an embodiment, the bin selection component 113 maintains a set of predefined threshold voltage offset bins (e.g., bin 0 to bin 9), in accordance with embodiments of the present disclosure. In an embodiment, the threshold voltage offset graph 300 can be subdivided into multiple threshold voltage offset bins each having a bin transition level (e.g., the bin transition level between bin 2 and bin 3 shown in FIG. 3), such that each bin corresponds to a predetermined range of threshold voltage offsets.

In an embodiment, the bin selection component 113 can use a threshold time level 340 to identify a younger data portion 350 and an older data portion 360. As shown in the example of FIG. 3, the data in bin 0 to bin 4 have a time after program that is below the threshold time level 340 and are identified in the younger data portion 350. For example, bin 0 can correspond to a time after program range of 0 hours to 2 hours (i.e., a bin 0 transition level of 2 hours), bin 1 can correspond to a time after program range of greater than 2 hours to 4 hours (i.e., a bin 1 transition level of 4 hours) bin 2 can correspond to a time after program range of greater than 4 hours to 8 hours (i.e., a bin 2 transition level of 8 hours), and bin 3 can correspond to a time after program range of greater than 8 hours to 12 hours (i.e., a bin 3 transition level of 12 hours) and bin 4 can correspond to a time after program range of greater than 12 hours to 16 hours (i.e., a bin 4 transition level of 16 hours). While the illustrative example of FIG. 3 defines four bins in the younger data portion 350, in other implementations, various other numbers of bins can be identified in the younger data portion 350 depending on the value of the threshold time level 340. Based on a periodically performed calibration process, the bin selection component 113 associates a memory unit with a threshold voltage offset bin, which defines a set of threshold voltage offsets to be applied to the base voltage read level in order to perform read operations, as described in more detail herein below.

The bin selection component 113 can identify a time after program associated with the data to be read in response to the read operation request. In an embodiment, the bin selection component 113 can perform the bin selection process to select a bin using the time after program for data in a younger data portion (e.g., data having a time after program that is less than a threshold time level). In an embodiment, if the data to be read is in an older bin (e.g., data having a time after program that is greater than or equal to the threshold time level), the bin selection process can perform a data state metric scan or measurement and use the data state metric value to select a bin for execution of the read operation. In an embodiment, the bin selection component 113 manages block families associated with the memory devices 130, as described in more detail herein below.

In an embodiment, the bin selection component 113 can consider one or more operating characteristics (e.g., temperature, error level data (e.g., a read error count, an error trigger rate, a raw bit error rate (RBER), etc.), a workload level, a lost clock event, etc.) of the memory sub-system 110 as part of the bin selection process. In an embodiment, the bin selection component 113 can determine or measure a temperature value associated with the memory sub-system. The measured temperature level can be used to adjust, update, or set one or more time after program ranges (e.g., a bin transition level) associated with the set of bins, as described in greater detail below. Accordingly, the bin selection component 113 can perform temperature compensation in connection with the bin selection to account for changes to the memory sub-system due to temperature variations.

In an embodiment, the bin selection component 113 can determine or measure an error level associated with the memory sub-system. The measured error level can be used to adjust, update, or set a time after program range or bin transition levels associated with one or more bins of the set of bins, as described in greater detail below. Accordingly, the bin selection component 113 can change or adjust the bin transitions levels based on error handling information. For example, the bin selection component 113 can establish a bin transition level of 8 hours for the transition from bin 0 to bin 1 if the measured error trigger rate is greater than 0.001 and adjust the bin transition level to 4 hours for the transition from bin 0 to bin 1 if the measured trigger rate is 0.01.

In an embodiment, the bin selection component 113 can identify a lost clock event (e.g., due to a power cycle of the memory sub-system 110) and perform the data state metric scan process to select a bin and corresponding read offset values for use with a read operation. In this embodiment, the bin selection component 113 can default to the scan-based bin selection in the event that the clock is lost (e.g., use scan-based bin selection if the memory sub-system loses power). In an embodiment, the bin selection component 113 can infer a time following a lost clock event by performing a data state metric measurement, and use the inferred time to calculate a time after program for use in the bin selection process.

In an embodiment, the bin selection component 113 can further consider a workload level of the memory sub-system in performing the bin selection process. For example, for a read operation requested during a low intensity workload level (e.g., wherein a measured workload level is less than a threshold workload level), the bin selection component 113 can perform a data state metric scan and use the measurement to select the bin and corresponding read level offsets to apply to the read operation. In another example, for a read operation requested during a high intensity workload level (e.g., wherein a measured workload level is greater than a threshold workload level), the bin selection component 113 can use the time after program associated with the data to be read to select the bin and corresponding read level offsets to apply to the read operation.

In an embodiment, the bin selection component 113 can adapt, adjust, update, modify, or change one or more bin transition levels based on feedback from one or more previous scan-based bin selections or one or more time-based bin selections. For example, the bin selection component 113 can review data associated with one or more prior data state metric scans or time-based bin selections and increase a bin transition level (e.g., for bin 2) from 7 hours to 9 hours.

In an embodiment, the bin selection component 113 can adapt, adjust, update, modify, or change one or more bin transition levels based on RBER feedback (e.g., a fail bit count) from previous transitions. For example, the bin selection component 113 can increase the bin transition level in response to determining that the three previous transitions showed an increase in RBER immediately after the transition. In this example, the bin selection component 113 can determine that, based on a change in the RBER, a bin transition level (e.g., corresponding to bin 3) is to be increased from 7 hours to 9 hours because the RBER increased after previous transitions, but then subsided after 2 additional hours.

Figure 4:
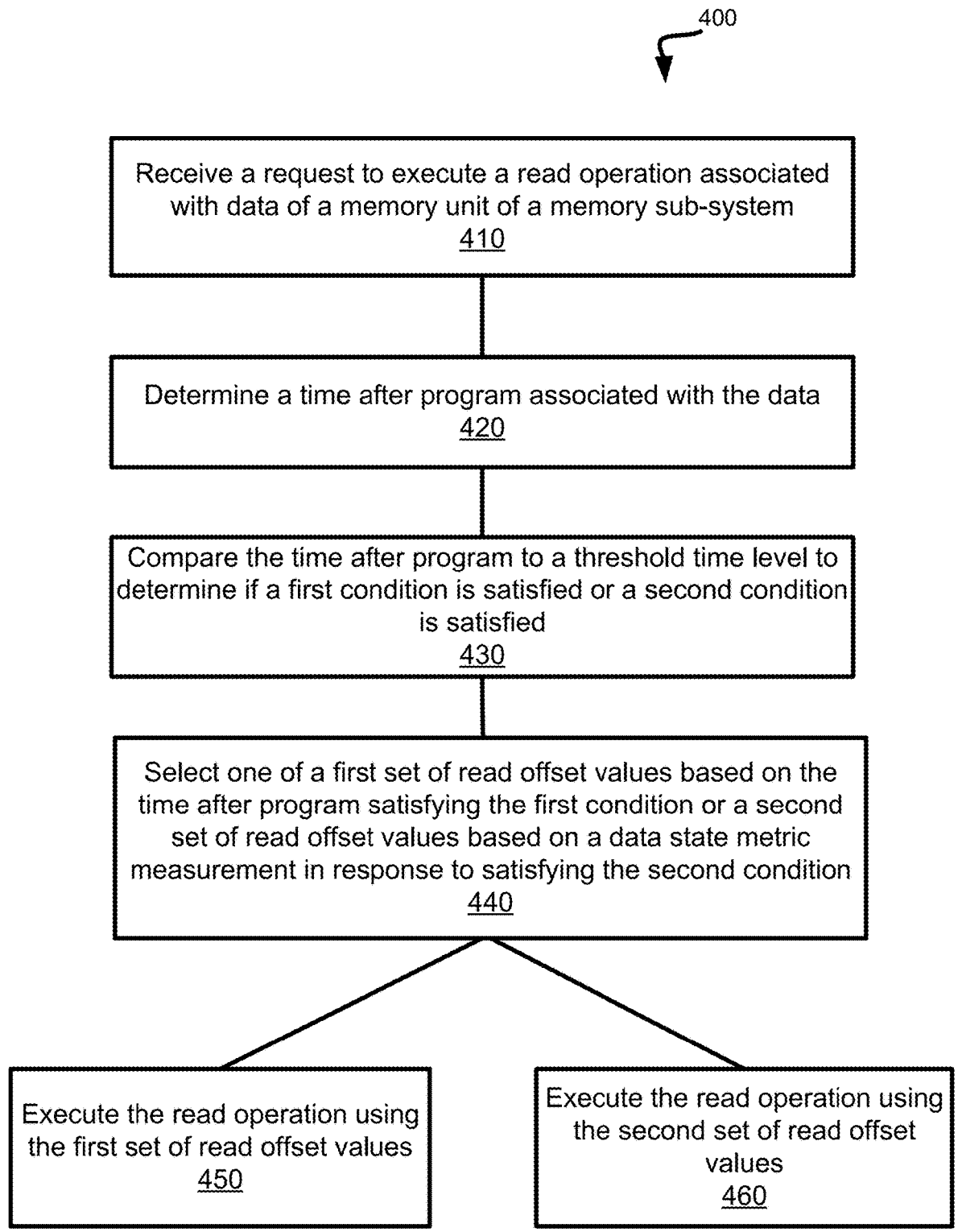
FIG. 4 is a flow diagram of an example method 400 for selecting a bin and corresponding set of read offset values, in accordance with embodiments of the present disclosure.

FIG. 4 is a flow diagram of an example method 400 of a bin selection process implemented by a memory sub-system controller operating in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the bin selection component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

In operation 410, the processing logic (e.g., a processing device of the bin selection component 113 of FIG. 1) receives a request to execute a read operation associated with data of a memory unit of a memory sub-system. In an embodiment, the memory unit can include a memory cell, a memory die, a memory block, a memory page, etc. including data to be read. In an embodiment, the processing logic can identify a time associated with the read request for use in determining a time after program associated with the data.

In operation 420, the processing logic determines a time after program associated with the data. In an embodiment, the time after program is determined by comparing a first time the data was programmed to the memory unit and a current time (e.g., a time of the read operation request). In an embodiment, the time after program can be estimated (e.g., inferred from a data state metric), or directly measured (e.g., from a controller clock).

In operation 430, the processing logic compares the time after program to a threshold time level to determine if a first condition is satisfied or a second condition is satisfied. In an embodiment, the threshold time level is established and maintained as a demarcation level to identify a younger portion of data (e.g., data having a time after program that is less than the threshold time level) and an older portion of data (e.g., data having a time after program that is greater than or equal to the threshold time level). FIG. 3 illustrates an example threshold time level 340 which is set to establish a younger data portion 350 in bin 0 to bin 4 and an older data portion 360 in bin 5 and above.

In an embodiment, the first condition is satisfied when the time after program associated with the data to be read is less than the threshold time level and is in the younger data portion. In an embodiment, the second condition is satisfied when the time after program is greater than or equal to the threshold time level. Accordingly, in an embodiment, in operation 430, the processing logic determines if the data to be read is in the younger data portion or the older data portion.

In operation 440, the processing logic selects one of a first set of read offset values based on the time after program in response to satisfying the first condition or a second set of read offset values based on a data state metric measurement satisfying the second condition. In an embodiment, the processing logic selects a bin and associated set of read offset values (e.g., a first set of read offset values) to apply to the read operation using a time-based approach if the first condition is satisfied (e.g., the data to be read is in the younger data portion). In an embodiment, the time after program value determined in operation 420 can be used to identify a bin corresponding to the data to be read. For example, as shown in FIG. 3, the processing logic can determine the data to be read has a time after program level that is less than the threshold time level 340 and select the bin based on the time after program 320 value. Advantageously, use of the time-based approach for the older data portion enables the selection and application of a set of read offset values that avoids unnecessary scanning for data in the younger data portion which has relatively greater margin and valley width between corresponding voltage distributions and exposure to fewer intervening power cycles, as compared to the older data portion.

In an embodiment, the processing logic selects a bin and associated set of read offset values to apply to the read operation using a scan-based approach if the second condition is satisfied (e.g., the data to be read is in the older data portion). In an embodiment, upon determining satisfaction of the second condition, the processing logic performs a scan to identify one or more data state metric values (e.g., an ideal read level 7 voltage). In this embodiment, the bin and corresponding set of read offset values are determined based on the scan of the data state metric values. Advantageously, use of the scan-based approach for the older data portion enables the selection and application of a set of read offset values that accounts for the higher degree of miscalibration due to changes in a slope of the temporal voltage shift corresponding to the data in the older data portion.

In operation 450, in response to the selection of the first set of read offset values (e.g., as a result of satisfying the first condition), the processing logic executes the read operation using the first set of read offset values. In an embodiment, in operation 460, if the second set of read offset values is selected as a result of satisfying the second condition, the processing logic executes the read operation using the second set of read offset values. As illustrated, the read operation requested in operation 410 is executed using either a first set of read offset values associated with a bin selected using a time-based approach or a second set of read offset values associated with a bin selected using a scan-based approach.

Figure 5:
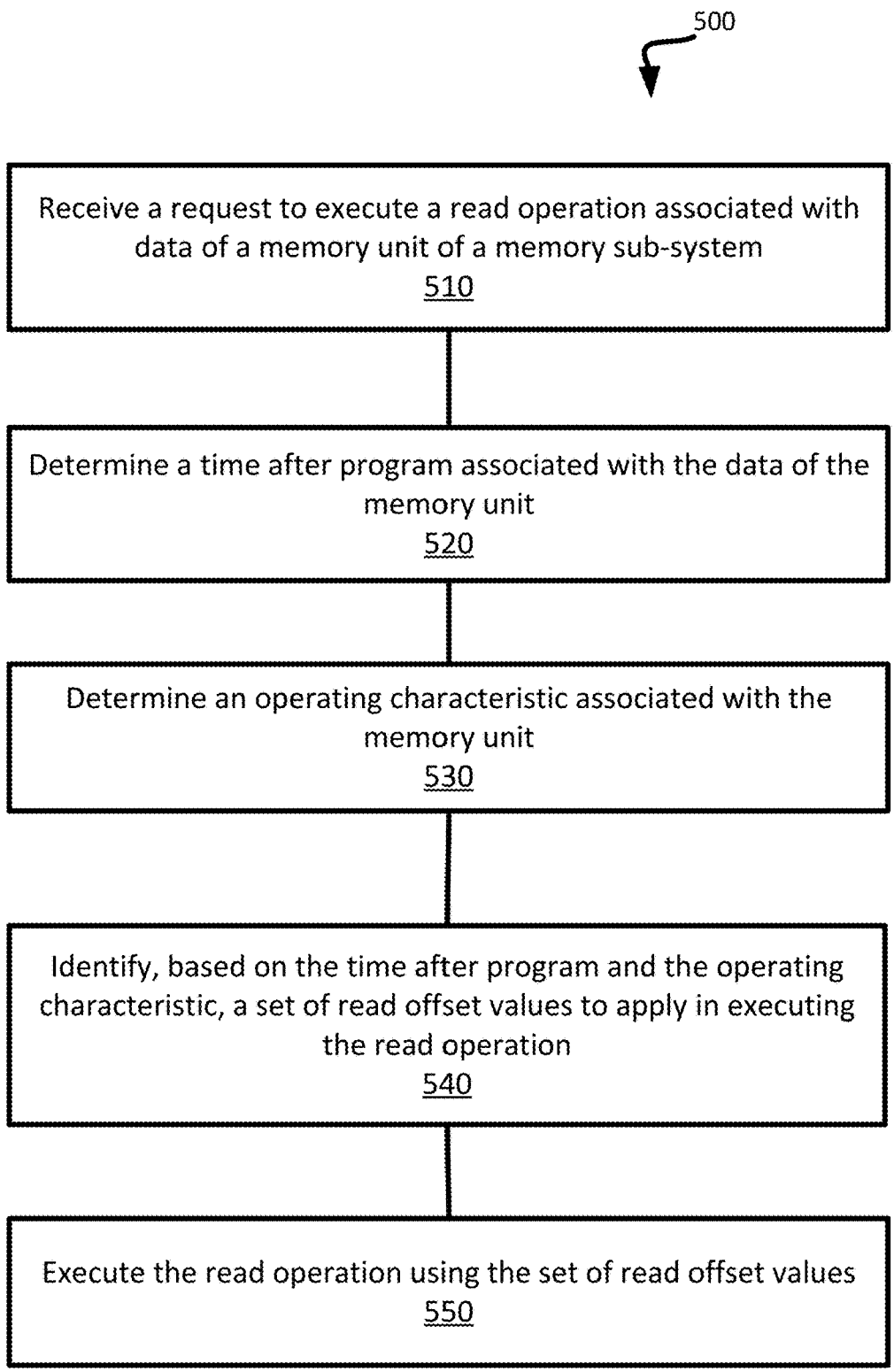
FIG. 5 is a flow diagram of an example method 500 for selecting a bin and corresponding set of read offset values based on a time after program and an operating characteristic, in accordance with embodiments of the present disclosure.

FIG. 5 is a flow diagram of an example method 400 of a bin selection process using a implemented by a memory sub-system controller operating in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the bin selection component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

Figure 6:
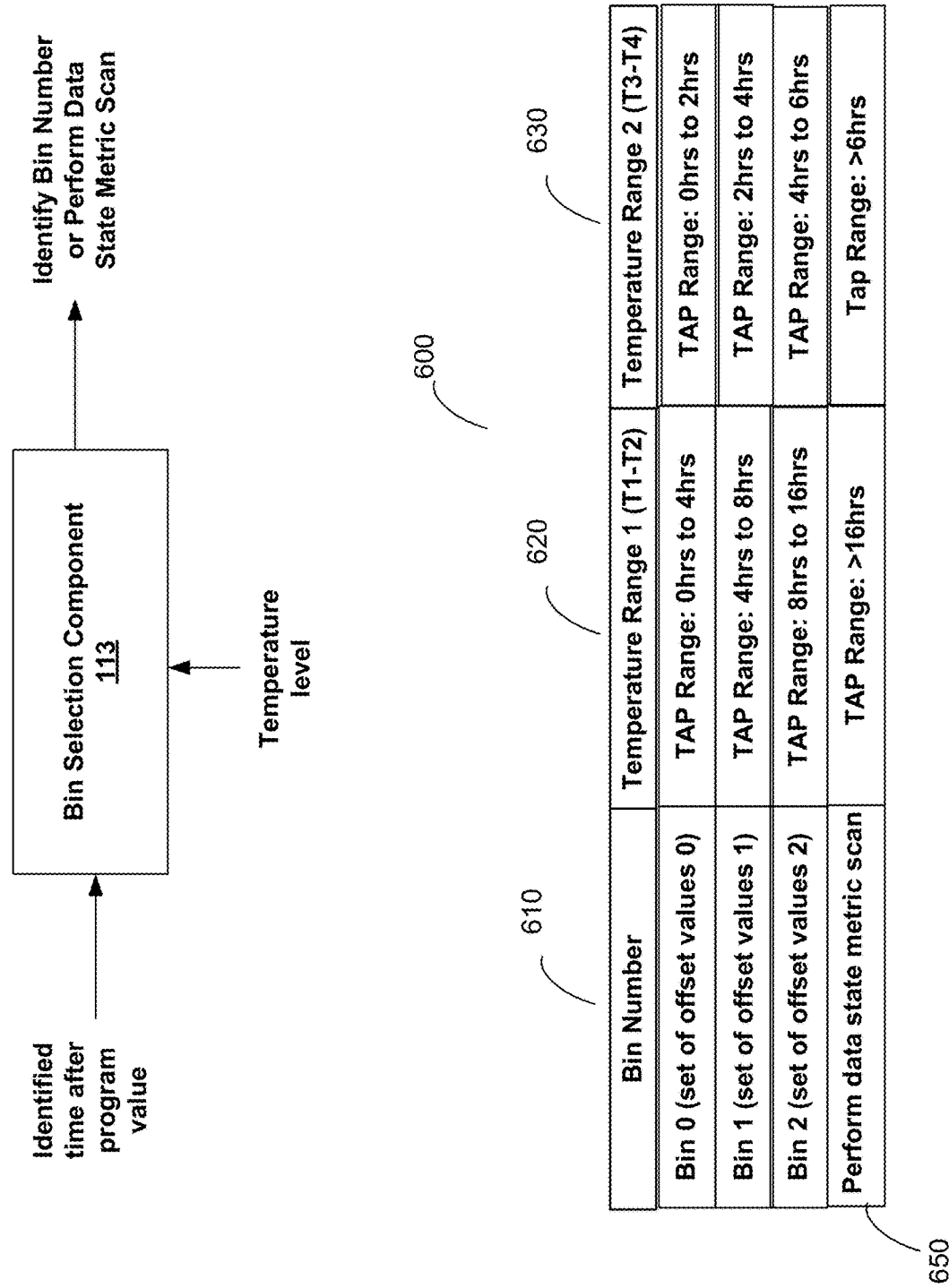
FIG. 6 illustrates an example bin selection component and data structure relating to a temperature level for use in selecting a set of read offset values, in accordance with embodiments of the present disclosure.

In operation 510, the processing logic receives a request to execute a read operation associated with data of a memory unit of a memory sub-system. In an embodiment, as shown in FIGS. 6 and 7, the processing device (e.g., bin selection component 113) identifies a request to read data stored in a memory unit (e.g., a memory cell, a memory die, a memory page, a memory block, a block family, etc.)

In operation 520, the processing device determines a time after program associated with the data of the memory unit. In an embodiment, the time after program of the data can be calculated (e.g., by comparing a time of the programming of the data and a current time) or inferred based on one or more data state metric values.

In operation 530, the processing logic determines an operating characteristic associated with the memory unit. In an example shown in FIG. 6, the operating characteristic is a temperature level associated with the memory unit. For example, the temperature level can be measured or otherwise identified and considered along with the time after program by the bin selection component 113 to identify a bin number based on the time after program or perform a data state metric scan. In FIG. 6, the bin selection component 113 can perform temperature compensation using the temperature level. In an embodiment, a data structure 600 can be maintained by the bin selection component 113 including a set of bins 610 each identified by a bin number e.g., bin 0, bin 1, bin 2). The data structure 600 can identify multiple temperature ranges 620, 630 and corresponding bin transition levels that are dependent on the temperature range. For example, temperature range 1 of T1 to T2 can be associated with a time after program range of 0 hours to 4 hours for bin 0, a time after program range of 4 hours to 8 hours for bin 1, and a time after program range of 8 hours to 16 hours for bin 2. As shown, temperature range 2 of T3 to T4 can be associated with a time after program range of 0 hours to 2 hours for bin 0, a time after program range of 2 hours to 4 hours for bin 1, and a time after program range of 4 hours to 6 hours for bin 2.

Figure 7:
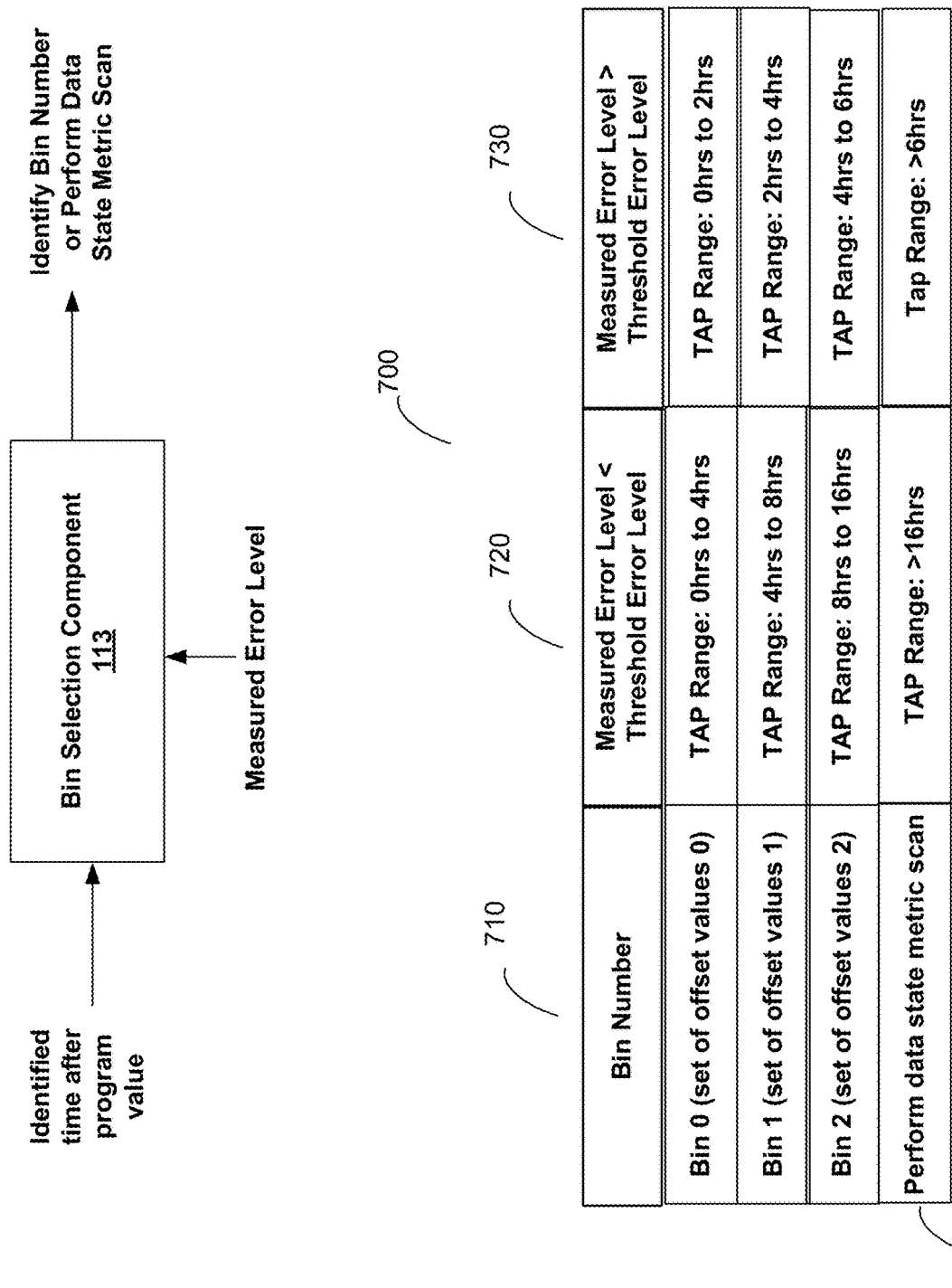
FIG. 7 illustrates an example bin selection component and data structure relating to an error level for use in selecting a set of read offset values, in accordance with embodiments of the present disclosure.

In an example shown in FIG. 7, the operating characteristic is an error level associated with the memory unit. For example, the error level can include an error count (e.g., a number of read errors), an error retry trigger rate, an RBER count, etc. The error level can be identified by the bin selection component 113 with the time after program in the bin selection process. In an embodiment, a data structure 700 can be maintained by the bin selection component 113 including a set of bins 710 each identified by a bin number e.g., bin 0, bin 1, bin 2). The data structure 700 can identify multiple error levels in view of a threshold error level. The threshold error level can be established by the bin selection component 113 and used for comparison with the measured error level. In FIG. 7, a first set of time after program ranges corresponding to the set of bins 710 can be identified for instances that the measured error level is less than the threshold error level 720. In the example shown, for data associated with a measured error level that is less than the threshold error level, bin 0 is associated with a time after program range of 0 hours to 4 hours, bin 1 is associated with a time after program range of 4 hours to 8 hours, and bin 2 is associated with a time after program range of 8 hours to 16 hours.

As shown in FIG. 7, a second set of time after program ranges corresponding to the set of bins 710 can be identified for instances that the measured error level is greater than the threshold error level 730. In the example shown, for data associated with a measured error level that is greater than the threshold error level, bin 0 is associated with a time after program range of 0 hours to 2 hours, bin 1 is associated with a time after program range of 2 hours to 4 hours, and bin 2 is associated with a time after program range of 4 hours to 6 hours.

In operation 540, the processing logic identifies, based on the time after program and the operating characteristic, a set of read offset values to apply in executing the read operation. In an embodiment, the processing logic can execute a look up operation using the appropriate data structure 600, 700 to determine whether to perform a time-based bin selection process or a data state metric scan-based bin selection process.

In an embodiment, bin selection is optimized by performing temperature compensation such that the bin transition levels are established in view of a temperature level (i.e., the operating characteristic). For example, with reference to data structure 600 of FIG. 6, if the identified time after program value is 2.6 hours and the temperature level is between T1 and T2 (e.g., 58° C.), bin 0 is selected. If, in another example, the identified time after program value is 2.6 hours and the temperature level is between T3 and T4 (e.g., 72° C.), bin 1 is selected.

In an embodiment, bin selection is optimized by performing error handing such that the bin transition levels are established in view of an error level (i.e., the operating characteristic). For example, with reference to data structure 700 of FIG. 7, if the identified time after program value is 2.6 hours and the error level (e.g., a read retry trigger rate) is less than the threshold error level (e.g., 0.010) bin 0 is selected. If, in another example, the identified time after program value is 2.6 hours and the error level is greater than the threshold error level, bin 1 is selected.

As shown in FIGS. 6 and 7, the bin selection component 113 can determine, based on the identified time after program and measured operating characteristic value that a data metric scan 650, 750 is to be performed to identify a set of read offset values to apply to the read operation. For example, as shown in FIG. 6, if the time after program is greater than 16 hours and the temperature level is in temperature range 1, the bin and associated set of read offset values is identified using a data state metric scan. In another example, as shown in FIG. 6, if the time after program is greater than 6 hours and the temperature level is in temperature range 2, the bin and associated set of read offset values is identified using a data state metric scan.

With reference to FIG. 5, in operation 550, the processing logic executes the read operation using the set of read offset values. Advantageously, the set of read offset values applied during execution of the read operation is selected in view of one or more operating characteristics of the memory sub-system.

In an embodiment, the operating characteristic can include a workload level of the memory sub-system. For example, the bin selection component 113 can determine a workload level associated with the memory sub-system for comparison with a threshold workload level. In an embodiment, if the workload level is below the threshold workload level, the bin selection component 113 determines the memory sub-system is operating in a low intensity level. In an embodiment, if the workload level is above the threshold workload level, the bin selection component 113 determines the memory sub-system is operating in a high intensity level. In an embodiment, when a low intensity workload level is identified, the bin selection component 113 can execute a data state metric scan to identify a bin and corresponding read offset values. In an embodiment, when a high intensity workload level is identified, the bin selection component 113 can perform bin selection based on the time after program.

In an embodiment, the bin selection component 113 can identify the occurrence of a lost clock event (e.g., an event that results in the loss of a clock used to track the time after program). In the event the clock is lost (e.g., due to a loss of power or a power cycle), the bin selection component 113 can default to performing a scan-based bin selection process, since the time after program information may be inaccurate or unreliable. In an embodiment, in response to a lost clock event, the bin selection component 113 could perform a data state metric scan and infer or determine a current time, and use the inferred current time to determine the time after program for use in the bin selection methods 400 and 500.

In an embodiment, the bin selection component 113 can adjust the bin transition levels (e.g., the time after program ranges 620, 630 of FIG. 6 and the time after program ranges 720, 730 of FIG. 7) based on feedback from previous scan-based transitions. For example, with reference to FIG. 6, the bin selection component 113 could increase the bin transition level associated with bin 1 from 8 hours to 10 hours (e.g., at temperature range 1) based on scan data from previous one or more scan-based transitions or time-based transitions.

Figure 8:
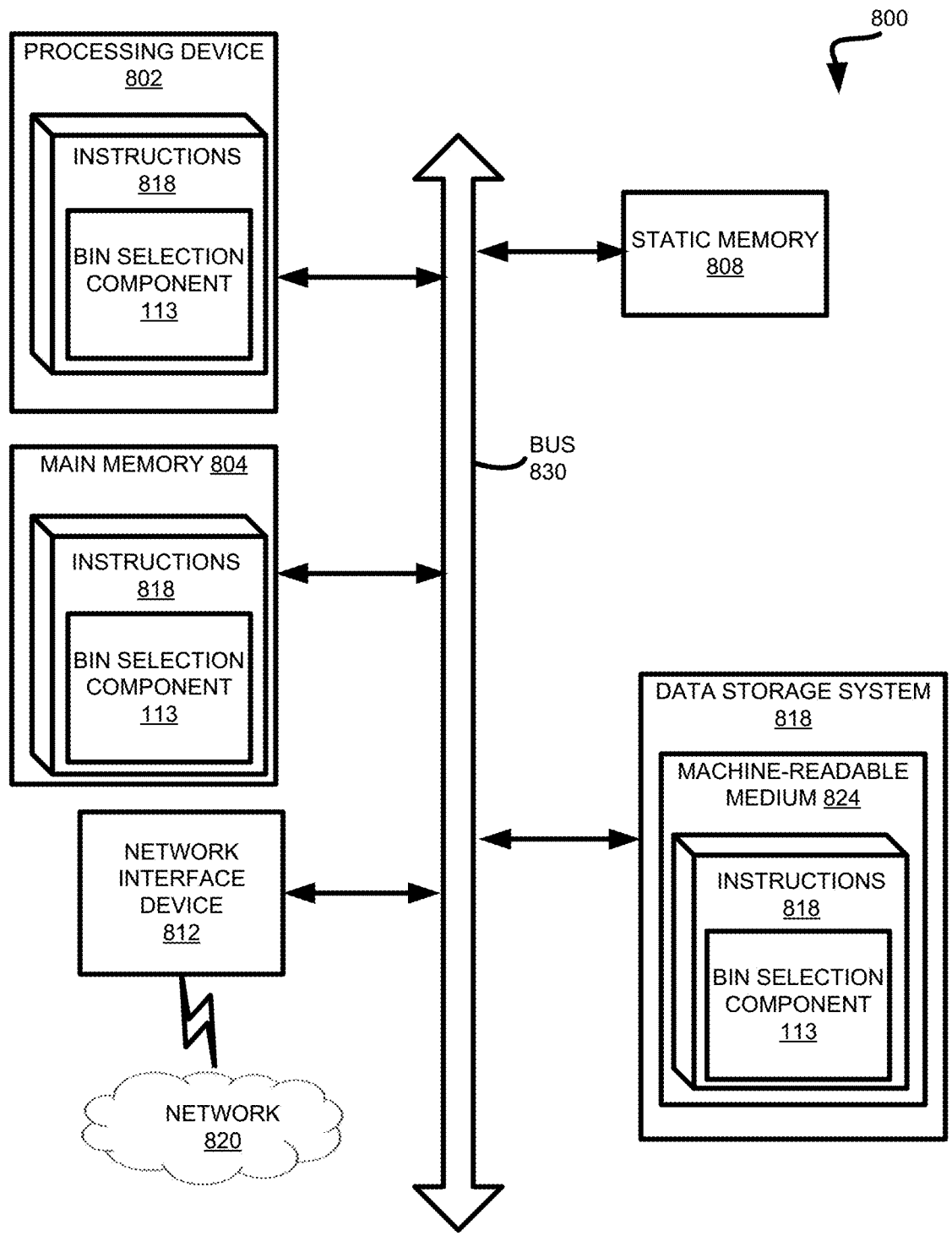
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the bin selection component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 810 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 828 for performing the operations and steps discussed herein. The computer system 800 can further include a network interface device 812 to communicate over the network 820.

The data storage system 818 can include a machine-readable storage medium 824 (also known as a computer-readable medium) on which is stored one or more sets of instructions 828 or software embodying any one or more of the methodologies or functions described herein. The instructions 828 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 828 include instructions to implement functionality corresponding to the bin selection component 113 of FIG. 1. While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving, by a processing device, a request to execute a read operation associated with data of a memory unit of a memory sub-system;
determining a time after program associated with the data;
comparing the time after program to a threshold time level to determine if a first condition is satisfied wherein the time after program is less than the threshold time level or a second condition is satisfied wherein the time after program is greater than the threshold time level; and
selecting one of:
a first set of read offset values based on the time after program in response to satisfying the first condition, wherein the first set of read offset values is associated with a first threshold voltage offset bin of a plurality of threshold voltage offset bins, or
a second set of read offset values based on a data state metric in response to satisfying the second condition.

2. The method of claim 1, further comprising executing the read operation using the first set of read offset values.

3. The method of claim 1, further comprising executing the read operation using the second set of read offset values.

4. The method of claim 1, wherein the first threshold voltage offset bin comprises the first set of read offset values.

5. The method of claim 1, wherein the second set of read offset values is associated with a second threshold voltage offset bin of a plurality of threshold voltage offset bins.

6. The method of claim 1, further comprising associating the memory unit with the first threshold voltage offset bin of the plurality of threshold voltage offset bins.

7. The method of claim 1, further comprising executing, in response to satisfying the second condition, a scan to determine the data state metric.

8. A system comprising:
a memory device; and
a processing device, operatively coupled to the memory device, the processing device to perform operations comprising:
receiving a request to execute a read operation associated with data of a memory unit of the memory device;
determining a time after program associated with the data of the memory unit;
determining an operating characteristic associated with the memory unit;
identifying, based on the time after program and the operating characteristic, a set of read offset values to apply in executing the read operation, wherein the set of read offset values is associated with a first threshold voltage offset bin of a set of threshold voltage offset bins; and
executing the read operation using the set of read offset values.

9. The system of claim 8, wherein the operating characteristic is a temperature level associated with the memory unit.

10. The system of claim 9, the operations further comprising:
determining the temperature level is within a first temperature range of a plurality of temperature ranges; and
identifying the set of threshold voltage offset bins corresponding to the first temperature range, wherein each threshold voltage offset bin of the set of threshold voltage offset bins is associated with a range of time after program values.

11. The system of claim 10, the operations further comprising:
determining the time after program associated with the data is within a first range of time after program values of the first threshold voltage offset bin of the set of threshold voltage offset bins; and
applying the first threshold voltage offset bin in executing the read operation.

12. The system of claim 8, wherein the operating characteristic is an error level associated with the memory unit.

13. The system of claim 12, the operations further comprising:
identifying, in response to determining the error level is less than a threshold error level, the set of threshold voltage offset bins, wherein each threshold voltage offset bin of the set of threshold voltage offset bins is associated with a range of time after program values.

14. The system of claim 13, the operation further comprising:
determining the time after program associated with the data is within a first range of time after program values of a first threshold voltage offset bin of the set of threshold voltage offset bins; and
applying the first threshold voltage offset bin in executing the read operation.

15. A non-transitory computer readable medium comprising instructions, which when executed by a processing device, cause the processing device to perform operations comprising:
- receiving a first request to execute a read operation associated with first data of a first memory unit of a memory sub-system;
- determining a time after program associated with the first data;
- comparing the time after program to a threshold time level to determine if a first condition is satisfied wherein the time after program is less than the threshold time level or a second condition is satisfied wherein the time after program is greater than the threshold time level; and
- selecting one of:
  - a first set of read offset values based on the time after program in response to satisfying the first condition, wherein the first set of read offset values is associated with a first threshold voltage offset bin of a plurality of threshold voltage offset bins, or
  - a second set of read offset values based on a data state metric in response to satisfying the second condition.

16. The non-transitory computer readable medium of claim 15, the operations further comprising executing the read operation using one of:
- the first set of read offset values in response to satisfying the first condition, wherein the first condition is satisfied upon determining the time after program is less than the threshold time level, or
- the second set of read offset values in response to satisfying the second condition, wherein the second condition is satisfied upon determining the time after program is greater than or equal to the threshold time level.

17. The non-transitory computer readable medium of claim 15, the operations further comprising:
- receiving a second request to execute a second read operation associated with second data of a second memory unit of the memory sub-system;
- determining an occurrence of a lost clock event;
- performing a scan to identify a data state metric measurement associated with the second data; and
- selecting a set of read offset values based on the data state metric measurement.

18. The non-transitory computer readable medium of claim 17, the operations further comprising executing the second read operation using the set of read offset values.

19. The non-transitory computer readable medium of claim 15, the operations further comprising adjusting a set of time after program values associated with a plurality of threshold voltage offset bins in response to one or more data state metric measurements.

20. The non-transitory computer readable medium of claim 15, the operations further comprising:
- receiving a second request to execute a second read operation associated with second data of a second memory unit of the memory sub-system;
- determining a workload level associated with the memory sub-system is less than a threshold workload level;
- performing a scan to identify a data state metric measurement associated with the second data; and
- selecting a set of read offset values based on the data state metric measurement.

* * * * *